(12) United States Patent
Lee et al.

(10) Patent No.: US 8,803,406 B2
(45) Date of Patent: Aug. 12, 2014

(54) FLEXIBLE NANOCOMPOSITE GENERATOR AND METHOD FOR MANUFACTURING THE SAME

(75) Inventors: Keon Jae Lee, Daejeon (KR); Kwi-Il Park, Daejeon (KR); Do Kyung Kim, Daejeon (KR); Sang Ouk Kim, Daejeon (KR); Geon-Tae Hwang, Daejeon (KR)

(73) Assignee: KAIST (Korea Advanced Institute of Science and Technology), Daejeon-si (KR)

( * ) Notice: Subject to any disclaimer, the term of this patent is extended or adjusted under 35 U.S.C. 154(b) by 251 days.

(21) Appl. No.: 13/307,870

(22) Filed: Nov. 30, 2011

(65) Prior Publication Data

US 2012/0133247 A1    May 31, 2012

(30) Foreign Application Priority Data

Nov. 30, 2010  (KR) .................. 10-2010-0120111
Oct. 31, 2011  (KR) .................. 10-2011-0087533

(51) Int. Cl.
*H01L 41/113* (2006.01)
*H01L 41/18* (2006.01)

(52) U.S. Cl.
USPC ............................. 310/339; 310/800

(58) Field of Classification Search
USPC ............................... 310/339, 800
See application file for complete search history.

(56) References Cited

U.S. PATENT DOCUMENTS

| 6,768,246 | B2 * | 7/2004 | Pelrine et al. | 310/339 |
| 7,728,492 | B2 * | 6/2010 | Axelrod et al. | 310/800 |
| 8,354,772 | B1 * | 1/2013 | Chen et al. | 310/311 |
| 2010/0033059 | A1 * | 2/2010 | Choi et al. | 310/339 |

FOREIGN PATENT DOCUMENTS

| KR | 1020060128360 | 12/2006 |
| KR | 1020090087280 | 8/2009 |

* cited by examiner

*Primary Examiner* — Derek Rosenau
(74) *Attorney, Agent, or Firm* — IP & T Group LLP

(57) ABSTRACT

There are provided a flexible nanocomposite generator and a method of manufacturing the same. A flexible nanocomposite generator according to the present invention includes a piezoelectric layer formed of a flexible matrix containing piezoelectric nanoparticles and carbon nanostructures; and electrode layers disposed on the upper and lower surfaces of both sides of the piezoelectric layer, in which according to a method for manufacturing a flexible nanocomposite generator according to the present invention and a flexible nanogenerator, it is possible to manufacture a flexible nanogenerator with a large area and a small thickness. Therefore, the nanogenerator may be used as a portion of a fiber or cloth. Accordingly, the nanogenerator according to the present invention generates power in accordance with bending of attached cloth, such that it is possible to continuously generate power in accordance with movement of a human body.

9 Claims, 19 Drawing Sheets

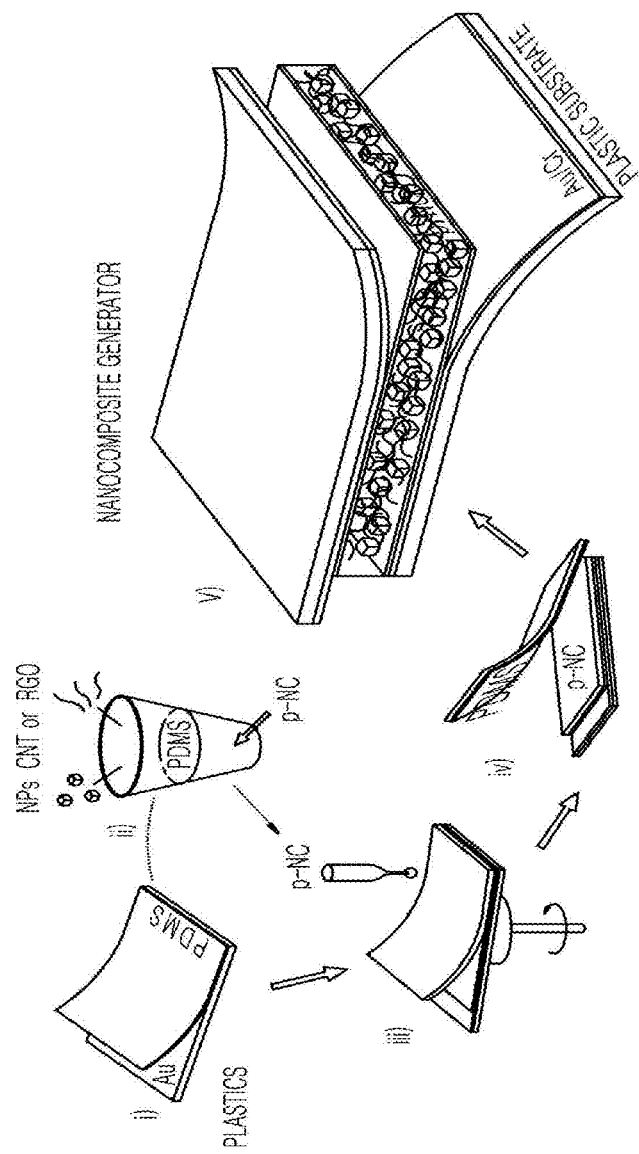

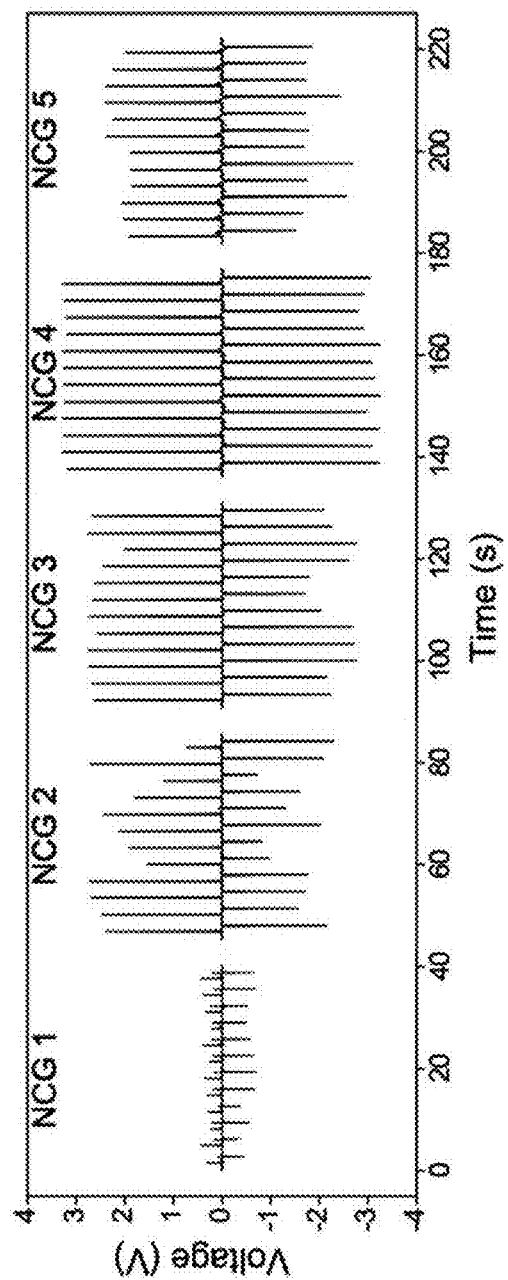

FLEXIBLE NANOCOMPOSITE GENERATOR AND METHOD FOR MANUFACTURING THE SAME

CROSS-REFERENCE TO RELATED APPLICATION

The present application claims priority of Korean patent application numbers 10-2010-0120111 filed on Nov. 30, 2010 and 10-2011-0087533 filed on Oct. 31, 2011, which are incorporated herein by reference in their entirety.

BACKGROUND OF THE INVENTION

The present invention relates to a flexible nanocomposite generator and a method for manufacturing the same, and more particularly, a flexible nanocomposite generator that can continuously generate power in accordance with movement of a human body and can also generate power by being used with a fiber, because power is generated by bending of a substrate, and a method for manufacturing the flexible nanocomposite generator.

Recently, an energy harvest technology that converts an external energy source (for example, thermal energy, vibration generated from the nature, such as movement of animals or wind and waves, and mechanical energy) has been widely researched as an eco-friendly technology. In particular, many groups research technologies of manufacturing a nanogenerator, because there is an advantage that it is possible to use biomechanical energy in a human body by integrating the nanogenerator in a small transplantable human body element.

One of the technologies of producing energy from mechanical energy of external vibration is to use the piezoelectric property of a ferroelectric substance. A technology of producing energy by using a piezoelectric substance is researched by many research groups and Chen et al. have proposed a nanogenerator using a lead zirconate titanate (PbZrxTi1-xO3, PZT) nanofiber on a bulk silicon substrate. According to the technology, PZT nanofibers engaged with opposite electrodes produces a considerably amount of voltage from pressure perpendicularly applied to the surface of a nanogenerator. Wang et al. have developed a high-efficiency nanogenerator by arranging ZnO nanowires showing a piezoelectric property in various shapes and have achieved a system that converts fine biomechanical energy, such as breath and a heartbeat of animals into electric energy by using the technology. Further, they also have implemented an LED and an LCD, using energy produced from the nanogenerator. Recently, a nanogenerator implemented by using a ceramic thin substance having a perovskite structure has been proposed.

However, the present technologies require complicate processes and large cost in manufacturing of the nanogenerator and have difficulty in achieving a large area, such that a flexible nanogenerator that can be applied to the fiber-IT technology has not been developed yet.

SUMMARY OF THE INVENTION

An embodiment of the present invention is directed to provide a flexible nanocomposite generator that can be manufactured to have a large area with a simple manufacturing process while showing high efficiency, and can be adjusted in fine thickness to a level where it can be used as a portion of cloth or a fiber, and a method of manufacturing the flexible nanocomposite generator.

In accordance with an embodiment of the present invention, a flexible nanocomposite generator includes: a piezoelectric layer; and electrode layers on upper and lower surface or both sides of the piezoelectric layer, in which the piezoelectric layer includes: a flexible matrix; piezoelectric layers dispersed in the flexible matrix; and carbon nanostructures dispersed in the matrix and electrically connect the piezoelectric nanoparticles.

In accordance with another embodiment of the present invention, a method of manufacturing a flexible nanocomposite generator, includes: producing a mixed solution by mixing piezoelectric nanoparticles and carbon nanostructures into a matrix solution; spin-coating the mixed solution on an electrode layer; and curdling the spin-coated mixed solution.

BRIEF DESCRIPTION OF THE DRAWINGS

FIG. 14B is a graph showing output voltages of flexible nanocomposite generators composed of various nanoparticles and carbon nanotubes.

DESCRIPTION OF SPECIFIC EMBODIMENTS

Figure 1:
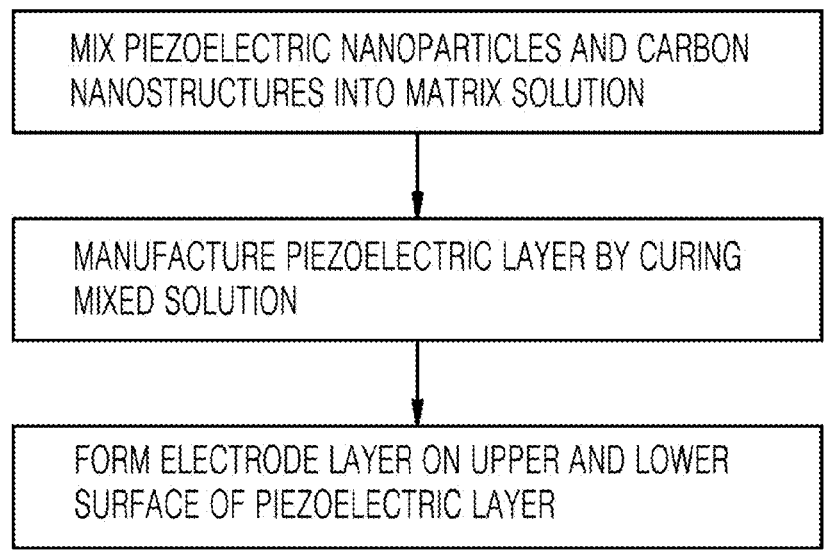
FIG. 1 is a flowchart illustrating a method of manufacturing a flexible nanocomposite nanogenerator according to an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

According to the present invention, in order to solve the problems in the related art, a thin piezoelectric layer is formed by using both a carbon nanostructure and nanoparticles having a piezoelectric property (hereafter, piezoelectric nanoparticles) for a piezoelectric layer. Therefore, according to the present invention, it is possible to use a nanogenerator composite sheet as a component of a fine fiber, such as cloth, such that it is possible to produce electricity from the cloth itself.

FIG. 1 is a flowchart illustrating a method of manufacturing a flexible composite nanogenerator according to an embodiment of the present invention.

Referring to FIG. 1, piezoelectric nanoparticles and a carbon nanostructure are mixed first in a liquid-state matrix that is a base of a piezoelectric layer. In an embodiment of the present invention, the matrix is polydimethylsiloxane (PDMS) that is a liquid state before being cured, the piezoelectric nanoparticles are nanoparticles of BaTiO3(BTO), and the carbon nanostructure is implemented by multi-wall carbon nanotubes. However, the scope of the present invention is not limited to the materials, and the matrix may be cured with all of nanoparticles composed of piezoelectric materials and all of materials having flexibility after being cured can be used in the present invention. Further, the carbon nanotube structure may be a graphene of one-dimensional graphite structure or a graphene oxide.

Thereafter, the matrix solution in which the piezoelectric nanoparticles and the carbon nanostructure are mixed is cured. In this process, according to the present invention, the thickness of the solution layer is decreased by applying the matrix solution onto a substrate and performing spin coating, in which, particularly, it is possible to manufacture a piezoelectric element that functions as a fiber material used for cloth by greatly decreasing the thickness of the piezoelectric element manufactured in a bulk state through the technological configuration.

Thereafter, an electrode layer is formed on the upper and lower surfaces of the piezoelectric layer, and in an embodiment of the present invention, the electrode layer includes a flexible substrate and a metal layer stacked on the substrate, in which the metal layer functions as a path for transmitting a current generated by bending of the substrate to the outside, in contact with the piezoelectric layer. Further, the electrode layer composed of the flexible substrate and the metal layer also functions as a kind of support substrate that supports a matrix solution of the piezoelectric layer in spin coating required for forming a thin piezoelectric layer.

EXAMPLE 1

Figure 2A:
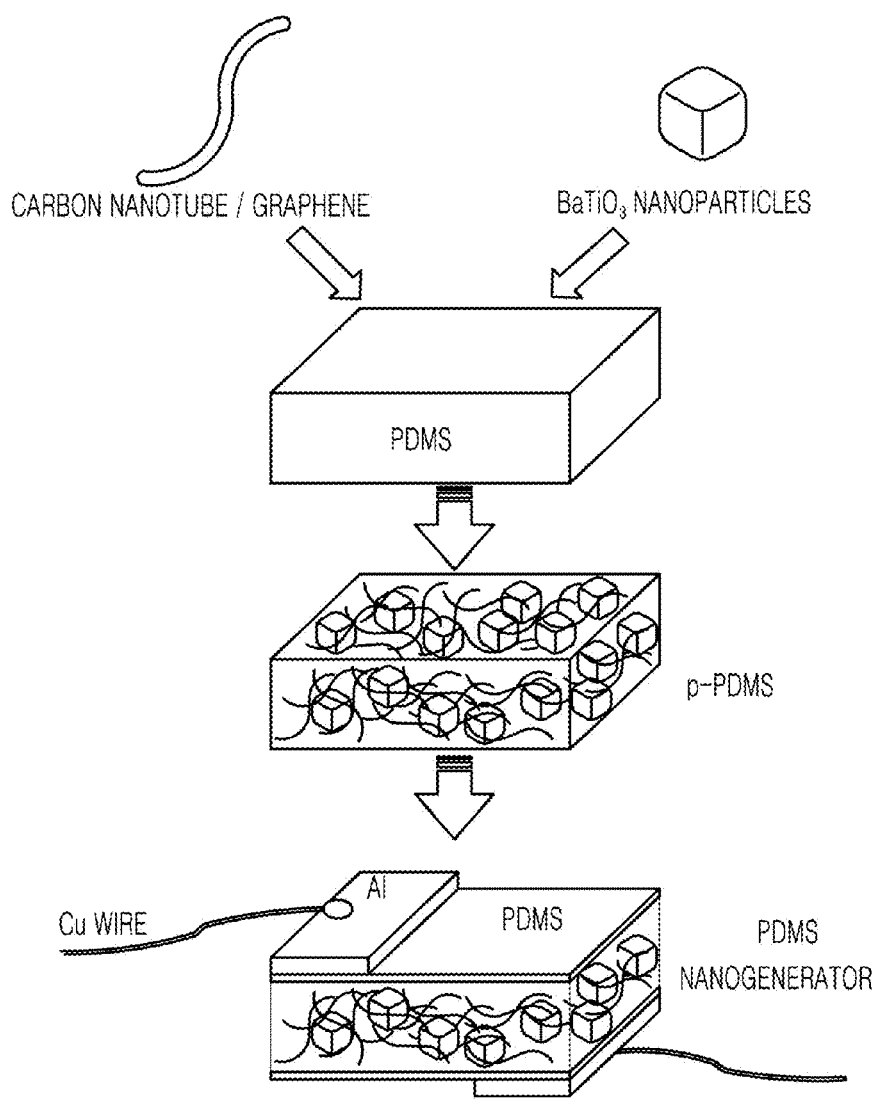
FIGS. 2 (2A and 2B) is a schematic process diagram illustrating the method of manufacturing a flexible nanocomposite nanogenerator according to an embodiment of the present invention.

First, referring to FIG. 2A, carbon nanotubes were used as a carbon nanostructure and it can be seen that the carbon nanotubes have a sufficient conductive network in the particles of BTO mixed in the PDMS substrate after curing. The carbon nanotubes may have a single wall or a multi-wall. The carbon nanotubes had a diameter of 20 nm or less and the particles of BTO had diameters of 100 nm or less in an example of the present invention. That is, it is preferable that the diameter ratio of the carbon nanotubes and the particles of BTO constituting the network is 1:5 or less, such that the particles of BTO are effectively dispersed by the carbon nanotubes.

In detail, 0.3 g of multi-wall carbon nanotubes (Carbon Nano-material Technology) having a diameter of about 20 nm and a length of about 10 nm and 0.3 g of particles of BTO having sizes of about 100 nm which were acquired by a hydrothermal method, which is a method of manufacturing nanoparticles by dissolving a reaction material in water and maintaining a predetermined temperature, were mixed in a methanol solution and mechanically stirred for one hour or more. Thereafter, the methanol solution was vaporized through calcinations in an oven (80° C., 24 hr). Thereafter, the well-mixed carbon nanotubes and nanoparticles of BTO were mixed with 30 g of PDMS containing a hardening agent and hardened. In this process, the weight ratio of the PDMS, nanoparticles of BTO, and carbon nanotubes of the flexible nanogenerator was 100:10:1.

Thereafter, the mixed solution was applied to a plastic cylinder and cured for one hour in an oven at 80° C., thereby manufacturing a PDMS-based flexible nanogenerator containing particles of BTO and multi-wall carbon nanotubes. Further, a flexible nanogenerator was manufactured in an element shape by sequentially stacking a dielectric layer (PDMS) and an electrode (aluminum, Al) onto the PDMS-based nanogenerator substrate and connecting wires with copper.

EXAMPLE 2

Referring to FIG. 2B, a nanocomposite material layer showing a piezoelectric property is formed by performing spin coating after mixing piezoelectric nanoparticles and carbon nanotubes in a PDMS solution, and then an electrode is formed on the nanocomposite material layer. According to an embodiment the electrode formed on the nanocomposite material may be an electrode composed of a plastic substrate-metal layer. The entire structure of the nanocomposite generator having this configuration is flexible.

Figure 3:
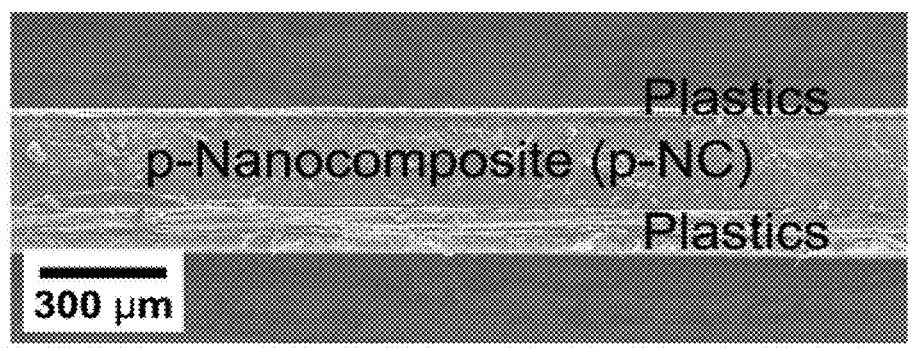
FIG. 3 is a scanning electron microscope (SEM) image of a flexible nanocomposite nanogenerator according to an embodiment of the present invention.

FIG. 3 is an SEM cross-sectional image of the nanocomposite generator manufactured in accordance with FIG. 2B of the present invention. FIG. 3 shows that a piezoelectric layer having a thickness of about 200 μm is formed between two layers composed of a PDMS and a gold/chrome/plastic substrate.

Figure 4:
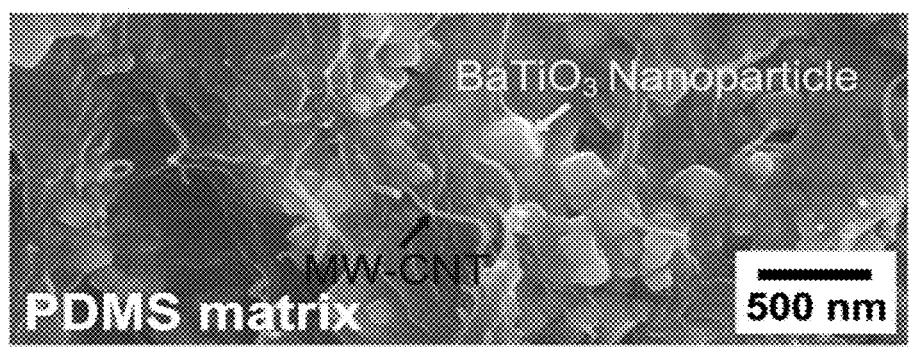
FIG. 4 is an SEM cross-sectional image of a nanocomposite material showing a piezoelectric property, which is manufactured in accordance with an example of the present invention.

FIG. 4 is an SEM cross-sectional image of the piezoelectric layer of the generator manufactured in accordance with FIG. 2B of the present invention. Referring to FIG. 4, it can be seen that nanoparticles of BTO and a multi-wall nanotubes were dispersed well in the PDMS matrix.

Figure 5:
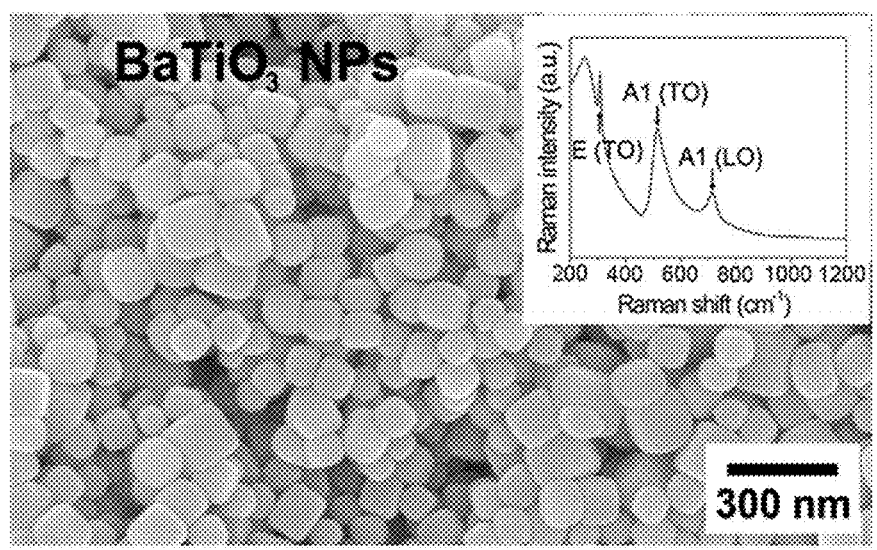
FIG. 5 is an SEM image of nanoparticles of $BaTiO_3$ manufactured by a hydrothermal method.

FIG. 5 is an SEM image of nanoparticles of BTO manufactured by a hydrothermal method. Referring to FIG. 5, piezoelectric nanoparticles according to the present invention have a size of 100 nm and a convex cubic shape. The graph at the right upper portion shows a Raman spectrum acquired from the nanoparticles of BTO used in the present invention, which shows that the nanoparticles of BTO have a phase showing a piezoelectric property.

Figure 6:
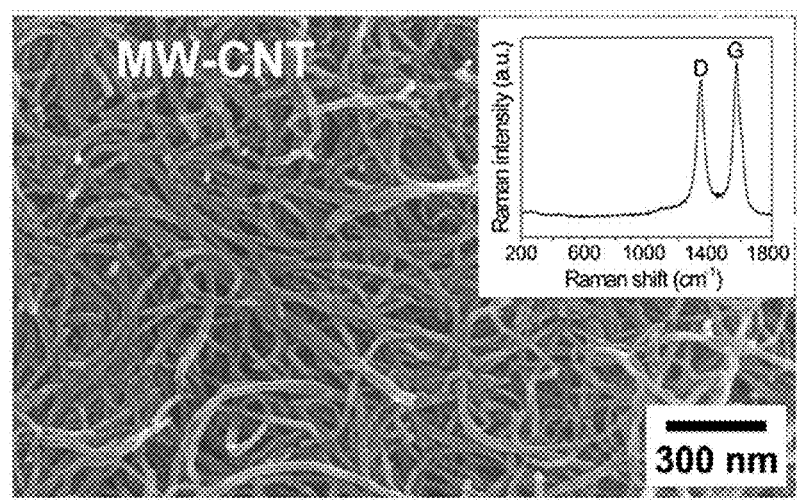
FIG. 6 is an SEM image showing the shape of multi-wall carbon nanotubes used in the present invention.

FIG. 6 is an SEM image showing the shape of a multi-wall carbon nanotube used in the present invention. Referring to FIG. 6, the multi-wall carbon nanotube used in the present invention shows a diameter of 20 nm and a length of 2 μm. The inserted image shows a typical Raman shift of the multi-wall carbon nanotube.

Figure 7:
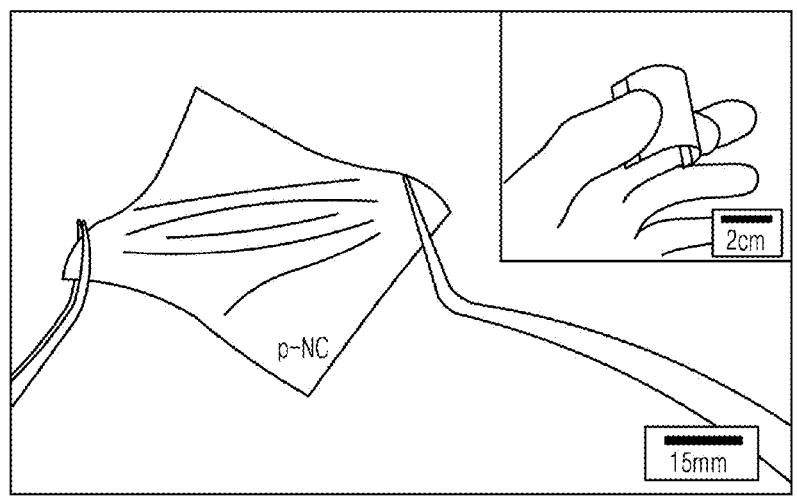
FIG. 7 is a photograph showing that a nanocomposite material showing a piezoelectric property is flexible after being manufactured in accordance with the present invention.

FIG. 7 is a picture showing that a nanocomposite material showing a piezoelectric property is pulled from both sides after being manufactured in accordance with the present invention. This shows that the nanocomposite material manufactured by the method is not only flexible, but an extendable material.

The image at the right upper portion in FIG. 7 shows a nanocomposite generator according to the present invention, which can be bent by a finger. The piezoelectric layer in this configuration is inserted in between a plastic substrate and a metal layer, such as gold/chrome, formed on the plastic substrate, and also functions as a nanogenerator. A chrome wire is fixed to a metal pad by a paste, such that it is possible to measure a voltage and a current generated from the nanogenerator according to the present invention.

Figure 8:
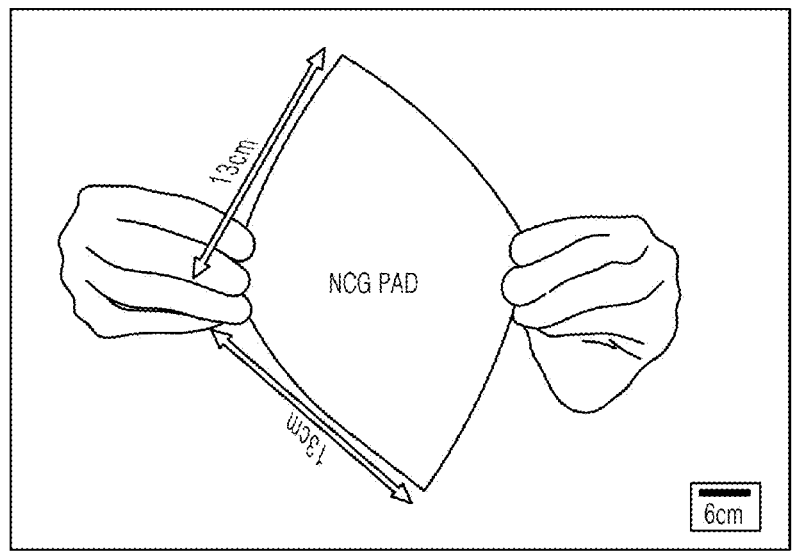
FIG. 8 is an image of a large-area nanogenerator element manufactured by spin coating, that is, according to the present invention, it is possible to manufacture a large-area nanocomposite generator, using piezoelectric nanoparticles and carbon nanotubes.

FIG. 8 is an image of a large-area nanogenerator element manufactured by spin coating. That is, according to the present invention, it is possible to manufacture a large-area nanocomposite generator, using piezoelectric nanoparticles and carbon nanotubes.

Figure 9:
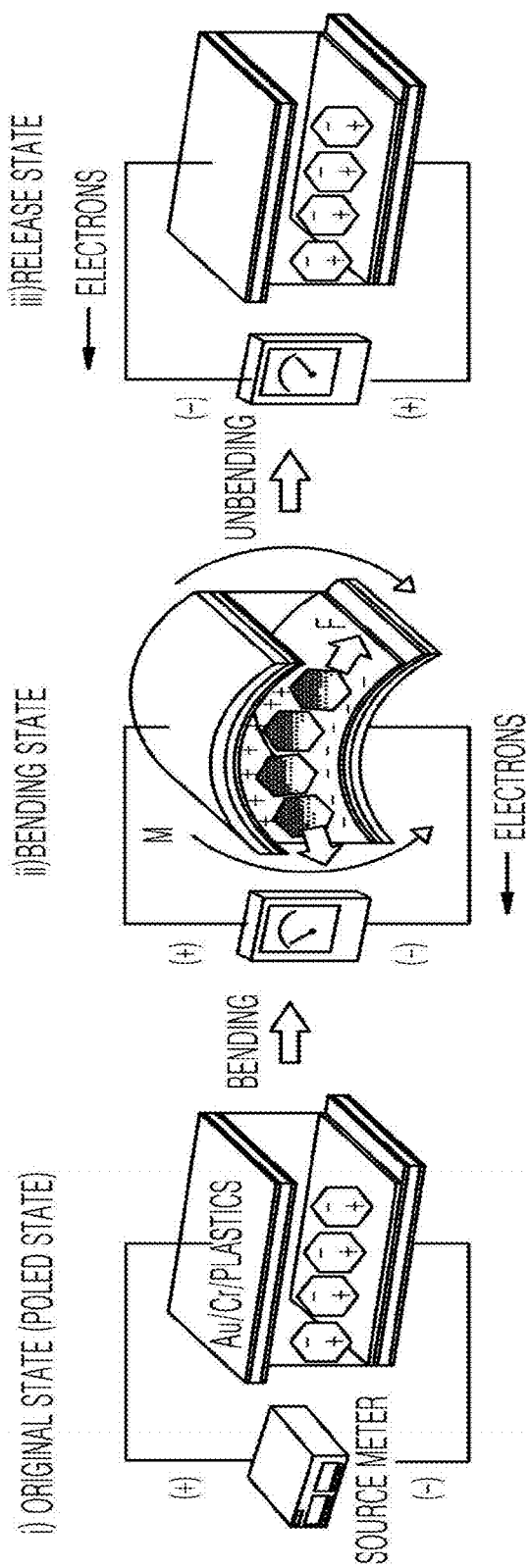
FIG. 9 is a view illustrating how a voltage and a current are produced in a nanocomposite generator according to the present invention.

FIG. 9 is a view showing how a voltage and a current are produced in a nanocomposite generator according to the present invention and shows electrode layers formed above/under a piezoelectric layer.

The detailed operation mechanism is as follows. First, a typical piezoelectric ceramic material has dipole moment that can be arranged in an intensive electric field. Most of regions having dipole moment are arranged in a DC electric field direction (i in FIG. 9) in an original state. The upper and lower electrodes of the generator are connected to a positive charge and a negative charge of a sourcemeter. When mechanical stress is applied to the nanogenerator according to the present invention and the nanogenerator is bent (ii in FIG. 9), positive and negative potentials are generated at the upper/lower portions, respectively, by the dipole of the nanoparticles. The produced electrons move from the lower electrode to the upper electrode through an external circuit, which generates an output voltage between the electrodes. Thereafter, the pressure applied to the nanogenerator according to the present invention is removed, such that the element returns to a release state (iii in FIG. 9). In this process, the piezoelectric potentials on both electrodes are removed while the electrons accumulated in the upper electrode move to the lower electrode through a circuit and generate electric signals in the opposite direction.

Figure 10:
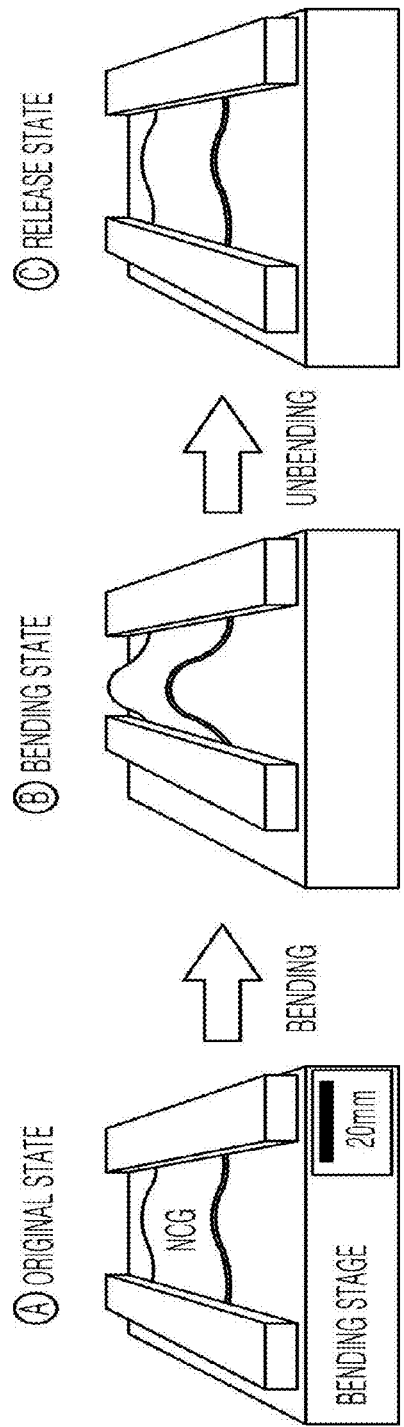
FIG. 10 is a photograph showing a nanocomposite generator in an original state, a bending state, and a release state.

FIG. 10 is a picture showing a nanogenerator in an original state, a bending state, and a release state.

Figure 11:
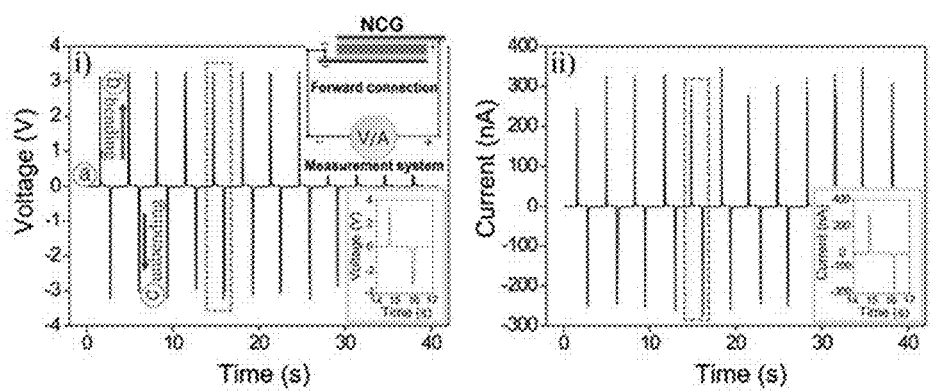
FIG. 11 is a graph showing an output voltage and a current signal, which are measured in a nanocomposite generator in accordance with repetitive bending and releasing.

FIG. 11 is a graph showing an output voltage (left) and a current signal (right), which are measured by repetitive bending and releasing.

Referring to FIG. 11, an output signal measured when the nanocomposite generator is connected in forward connection to measuring equipment shows a pattern corresponding to the mechanical state of a repetitive element of the nanocomposite generator. The image inserted at the lower portion shows an enlarge region of the output signal.

Figure 12:
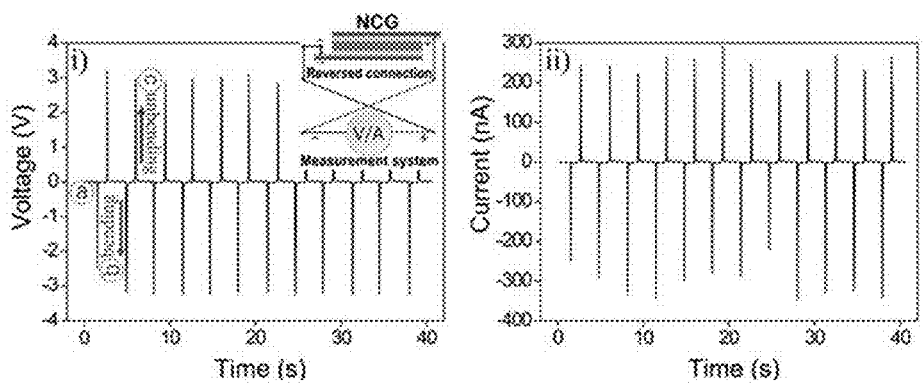
FIG. 12 is a graph showing an output voltage and a current signal in inverse connection to FIG. 11, in which it can be seen from the result that the measured voltage and current values are produced from a practical element.

FIG. 12 shows an output voltage (left) and a current signal (right) in reverse connection. It is seen from the results that the measured outputs are signals produced from an element by repetitive bending and releasing.

Figure 13:
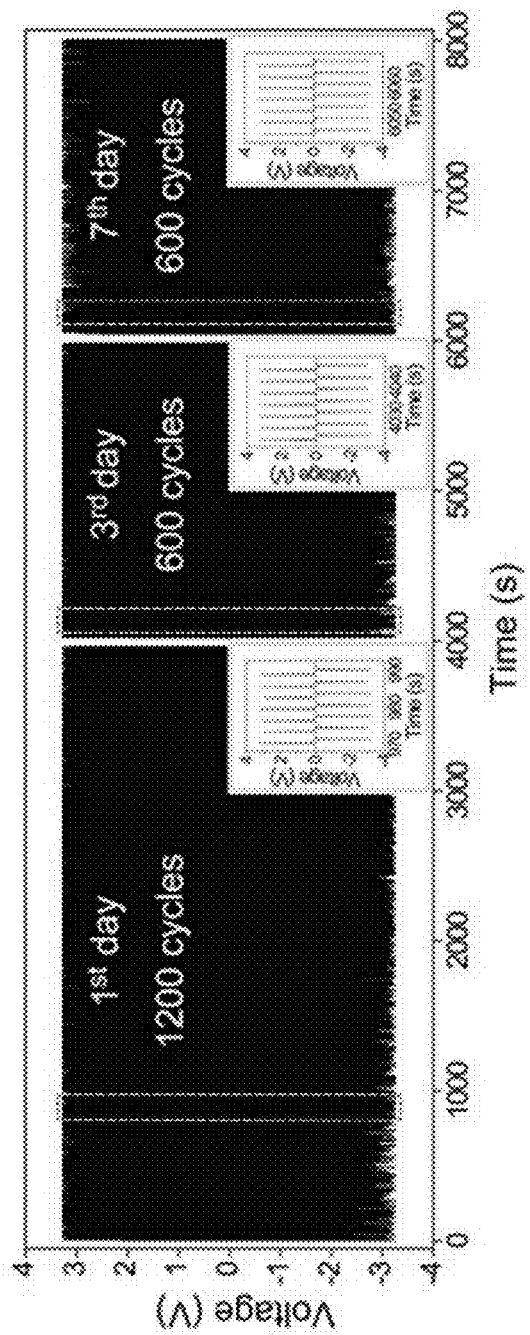
FIG. 13 is a view showing a durability test result for checking mechanical strength of an element according to the present invention.

FIG. 13 shows a durability test result for checking mechanical stability of an element according to the present invention. Referring to FIG. 13, the value measured for 1200 times of bending and the magnitude of a voltage measured after seven days were not changed, such that it can be seen that the nanogenerator according to the present invention is mechanically stable.

Figure 14A:
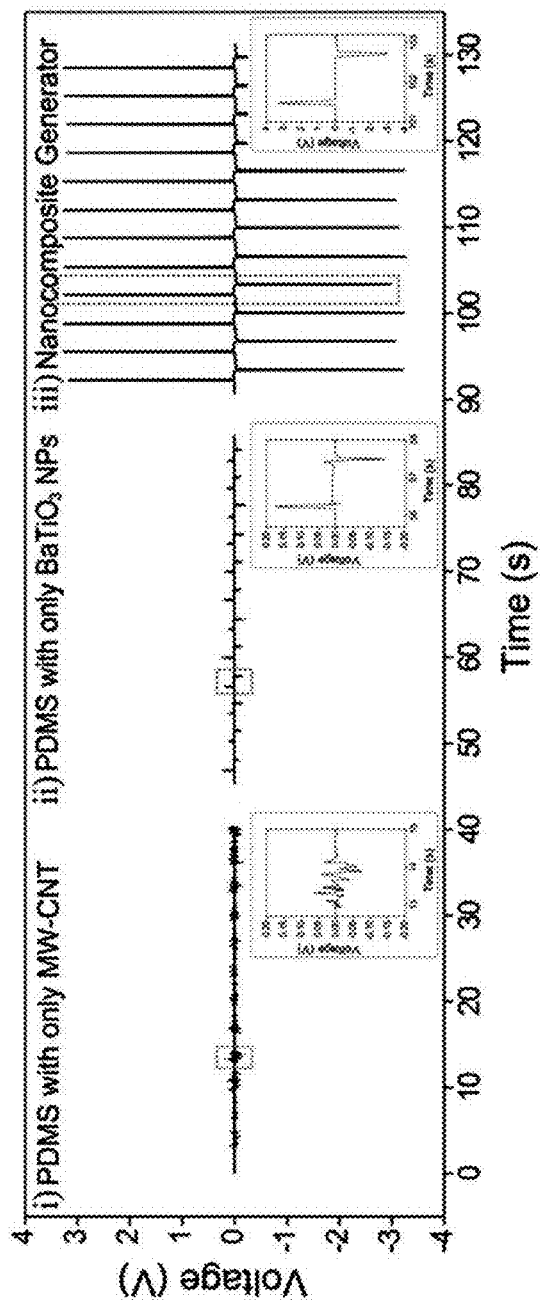
FIG. 14A is a graph comparing an output voltage produced from an element manufactured by a PDMS containing only BTO nanoparticles and multi-wall carbon nanotubes with a nanocomposite generator.

FIG. 14A shows an output voltage (i and ii in FIG. 14A) produced from an element made of a PDMS containing only nanoparticles of BTO and multi-wall carbon nanotubes. On the other hand, iii of FIG. 14A shows an output voltage of a nanogenerator manufactured in accordance with the present invention. The inserted images show enlarged regions of an output signal. Referring to FIG. 14A, it can be seen that sufficient power production effect cannot be expected when using only nanoparticles or multi-wall carbon nanotubes in a piezoelectric layer.

FIG. 14B shows an output voltage of a flexible nanocomposite generator having various compositions according to the embodiment.

Table 1 shows content ratios of carbon nanotubes and nanoparticles of BTO according to various embodiments of the present invention.

TABLE 1

| Item | Multi-wall carbon nanotube (weight, g) | Nanoparticles of BTO (weight, g) |
| --- | --- | --- |
| Content ratio 1 (NCG1) | 0.5 | 12 |
| Content ratio 2 (NCG2) | 1 | 6 |
| Content ratio 3 (NCG3) | 1 | 9 |
| Content ratio 4 (NCG4) | 1 | 12 |
| Content ratio 5 (NCG5) | 1 | 20 |

Referring to FIG. 14, the multi-wall carbon nanotubes should be at least 1 wt % and the nanoparticles of BTO are 12 wt % or more and preferably 20 wt % or less. In particular, it can be seen that the output voltage is the maximum at the composition ratio according to the content ratio 4.

Figure 15:
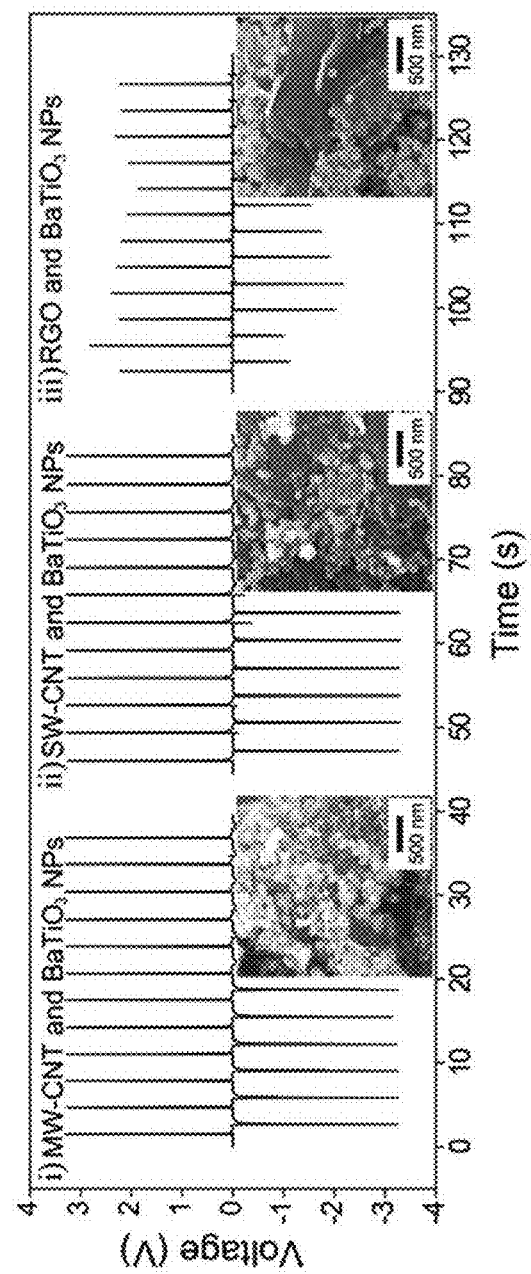
FIG. 15 is a graph showing an output voltage measured when multi-wall carbon nanotubes, single-wall carbon nanotubes, and a reduction graphene in a nanocomposite generator.

FIG. 15 shows output voltages when multi-wall carbon nanotubes (i), single-wall carbon nanotubes (ii), and a reduction graphene (iii) are used with nanoparticles of BTO in a piezoelectric layer.

Referring to FIG. 15, the carbon nanotubes have excellent power generation effect more than a reduced graphene. In particular, the expensive single-wall carbon nanotube and the inexpensive multi-wall carbon nanotube generate substantially the same power generation effect, such that when the multi-wall carbon nanotubes are used for a carbon nanotube structure, a large-area nanogenerator can be manufactured at a low cost.

Figure 16:
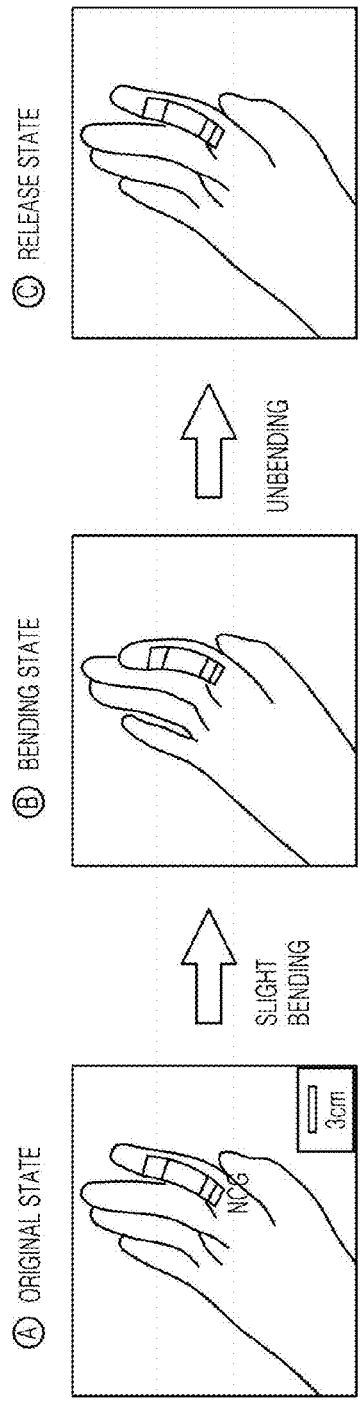
FIG. 16 is an image of a small nanogenerator (1.5 cm×4 cm) attached to a person's finger.

FIG. 16 is an image of a small nanogenerator (1.5 cm×4 cm) attached to a person's finger. It can be seen that the element can bend in an original state, a bending state, and a release state.

Figure 17:
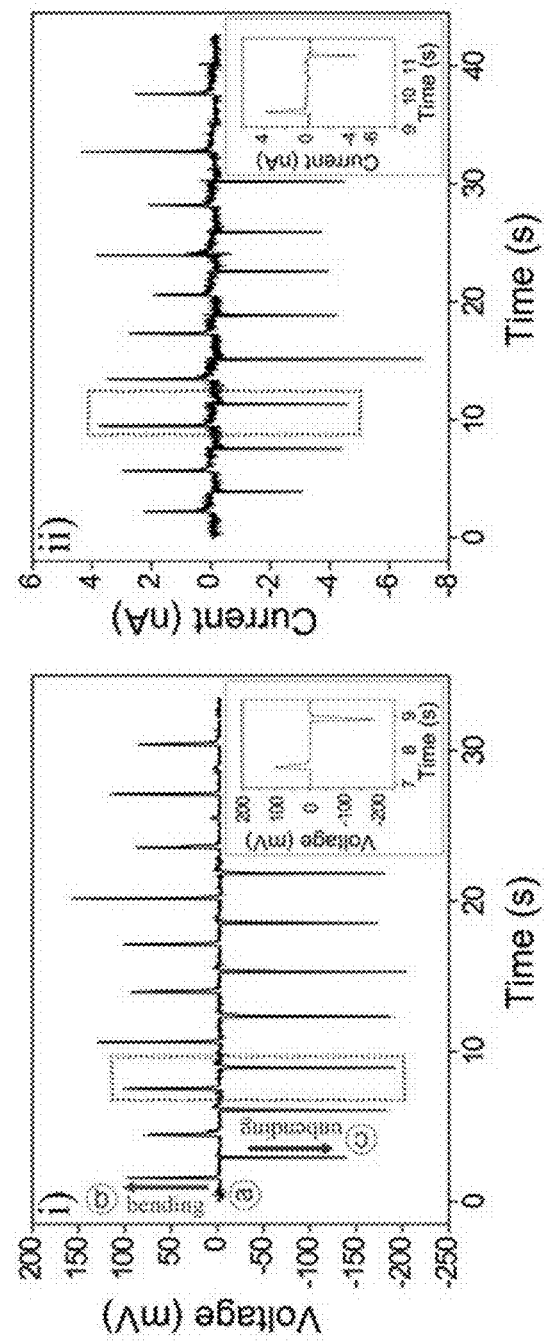
FIG. 17 is a graph showing an output voltage and current measured in accordance with fine movement of a finger in a nanocomposite generator attached to the person's finger of FIG. 16.

FIG. 17 is a graph showing an output voltage according to action of a person's finger. Referring to FIG. 17, it can be seen that the output voltage shows periodical positive and negative values in accordance with bending and releasing and that the output voltage corresponds to the states of the nanocomposite generator. The image inserted at the lower portion in the picture shows an enlarged region of an output signal.

Figure 18:
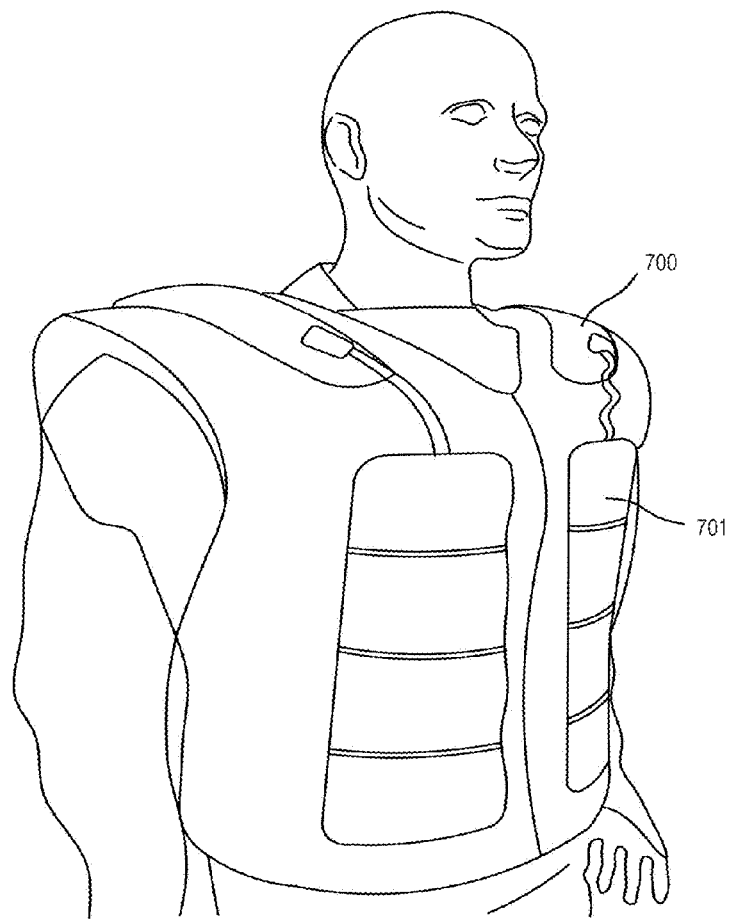
FIG. 18 is a view showing an application of a nanocomposite nanogenerator according to an embodiment of the present invention.

FIG. 18 is shows an application of a nanocomposite nanogenerator according to an embodiment of the present invention.

As described above, a nanocomposite generator according to the present invention includes a thin piezoelectric layer, has flexibility, and generates an electric signal in accordance with mechanical stress. Therefore, it is possible to generate power by a portion of or the entire nanogenerator according to the present invention into a fiber material that receives a mechanical force in accordance with movement of a person. Referring to FIG. 18, a nanogenerator 701 according to the present invention is provided in a cloth fiber in a large area, electricity generated from the nanogenerator 701 flows to a rectifier 700 electrically connected with the nanogenerator 701 to be rectified and then can be stored in an energy storage device, such as a capacitor or a secondary battery.

Figure 19:
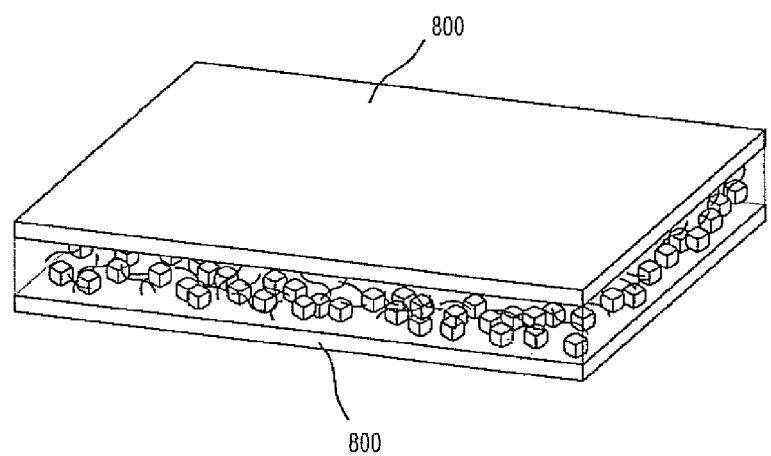
FIG. 19 is a picture showing an example of using a conductive organic compound as an electrode instead of a plastic substrate.

FIG. 19 is a picture showing an example of using a conductive organic compound as an electrode instead of a plastic substrate. Referring to FIG. 19, it is possible to manufacture a more flexible nanogenerator in various shapes by using a conductive organic material 800 as an electrode, instead of gold/chrome/plastic in a nanogenerator according to the present invention.

Figure 20:
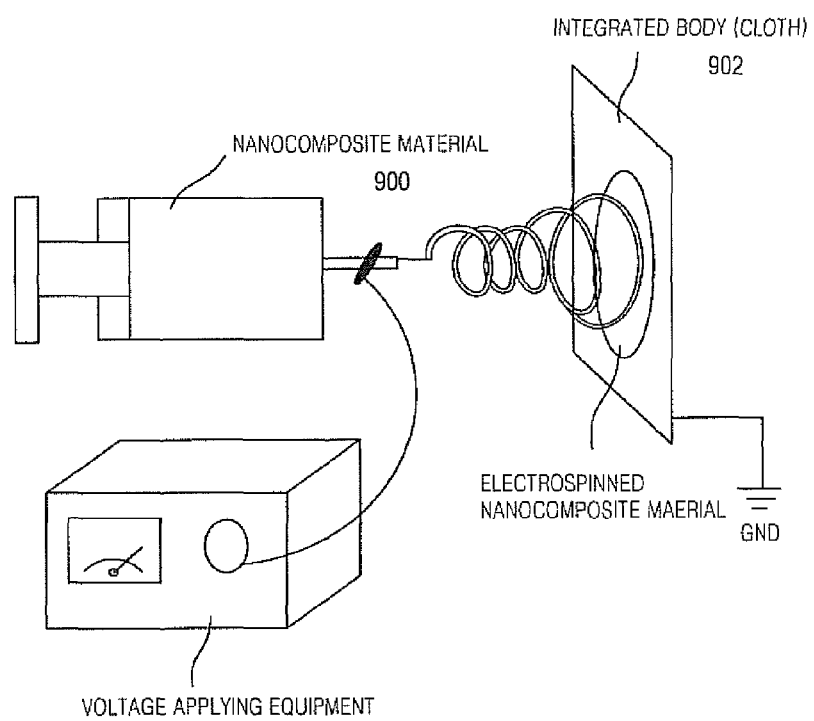
FIG. 20 is a picture showing an example of implementing cloth by scattering a nanocomposite material showing a piezoelectric property, using electrospinning.

FIG. 20 is a picture showing an example of implementing cloth by scattering a nanocomposite material showing a piezoelectric property, using electrospinning. Referring to FIG. 20, it is possible to fabricate cloth that can generate electricity from movement of a human body by scattering a nanocomposite material 900 having a piezoelectric property manufactured by the present invention onto the entire cloth 902 by electrospinning by using high-voltage equipment.

As described above, according to the present invention, it is possible to economically manufacture a thin nanogenerator having various areas and the nanogenerator can be used as a portion of or the entire fiber by being connected with a fiber.

According to a method for manufacturing a flexible nanocomposite generator of the present invention and a flexible nanogenerator manufactured by the method, it is possible to manufacture a flexible nanogenerator with a large area and a small thickness. Further, the nanogenerator may be used as a portion of a fiber or cloth. Accordingly, the nanogenerator according to the present invention generates power in accordance with bending of attached cloth, such that it is possible to continuously generate power in accordance with movement of a human body.

While the present invention has been described with respect to the specific embodiments, it will be apparent to those skilled in the art that various changes and modifications may be made without departing from the spirit and scope of the invention as defined in the following claims.

What is claimed is:

1. A flexible nanocomposite generator comprising:
a piezoelectric layer; and
electrode layers on upper and lower surfaces of the piezoelectric layer,
wherein the piezoelectric layer includes:
a flexible matrix;
piezoelectric nanoparticles dispersed in the flexible matrix; and
carbon nanostructures increasing a piezoelectric effect by dispersing the piezoelectric nanoparticles in the flexible matrix and giving conductivity to the flexible matrix.

2. The flexible nanocomposite generator according to claim 1, wherein the piezoelectric layer is a cured material in which the piezoelectric nanoparticles and the carbon nanostructures are mixed.

3. The flexible nanocomposite generator according to claim 2, wherein the carbon nanostructures are formed of one of a single-wall carbon nanotubes, multi-wall carbon nanotubes, graphene, or graphene oxide.

4. The flexible nanocomposite generator according to claim 2, wherein the piezoelectric layer is a layer that is spin-coated after mixing the piezoelectric nanoparticles and the carbon nanostructures into a liquid-state of the flexible matrix, before being cured.

5. The flexible nanocomposite generator according to claim 4, wherein the piezoelectric nanoparticles are nanoparticles of $BaTiO_3$ (BTO).

6. The flexible nanocomposite generator according to claim 5, wherein the flexible matrix is a polydimethylsiloxane (PDMS).

7. The flexible nanocomposite generator according to claim 6, wherein each of the electrode layers includes:
a flexible substrate; and
a metal layer stacked on the flexible substrate.

8. The flexible nanocomposite generator according to claim 6, wherein each of the electrode layers is a conductive organic material layer.

9. The flexible nanocomposite generator according to claim 3, wherein a weight ratio of the multi-wall carbon nanotubes and the piezoelectric nanoparticles is 1:12.

* * * * *